United States Patent [19]
Jeon et al.

[11] Patent Number: 5,943,257
[45] Date of Patent: Aug. 24, 1999

[54] FERROELECTRIC MEMORY DEVICE AND DATA PROTECTION METHOD THEREOF

[75] Inventors: Byung-Gil Jeon, Suwon; Yeon-Bae Chung, Sungnam-shi, both of Rep. of Korea

[73] Assignee: Samsung Electronics Co., Ltd., Suwon, Rep. of Korea

[21] Appl. No.: 09/113,141

[22] Filed: Jul. 10, 1998

[30] Foreign Application Priority Data

Jul. 16, 1997 [KR] Rep. of Korea ................ 97-33341

[51] Int. Cl.[6] ................................... G11C 11/22
[52] U.S. Cl. ............................ 365/145; 365/228
[58] Field of Search ................. 365/145, 149, 365/226, 228

[56] References Cited

U.S. PATENT DOCUMENTS 5,574,679  11/1996  Ohtsuki et al. ............... 365/145
5,703,804  12/1997  Takata et al. ................. 365/145

Primary Examiner—Son Mai
Attorney, Agent, or Firm—Jones Volentine, LLP

[57] ABSTRACT

A nonvolatile ferroelectric semiconductor random access memory device and a method for protecting ferroelectric memory cell capacitors from data damage are provided. The contents of the FRAM cells are protected against damage when a power supply voltage goes lower than a predetermined threshold voltage level. Since chip power off time is about several milliseconds and it takes several nanoseconds for a memory chip to perform a normal operation such as a read/write operation, the memory device completes the current read/write operation during either unexpected power down or power off mode, thereby protecting data stored in ferroelectric memory cells against damage when a power supply voltage goes down.

22 Claims, 10 Drawing Sheets

FERROELECTRIC MEMORY DEVICE AND DATA PROTECTION METHOD THEREOF

FIELD OF THE INVENTION

The present invention relates generally to semiconductor integrated circuit memory devices and, more particularly, to a nonvolatile semiconductor random access memory device having ferroelectric memory cell capacitors and a method for protecting the ferroelectric memory cell capacitors from data damage when a power supply voltage is at a lower voltage level, for example, during power up, unexpected power down, or power off state.

BACKGROUND OF THE INVENTION

The characteristic that defines ferroelectric is its spontaneous polarization which can be reversed by an electric field. Various ferroelectric materials are known, such as the PZT family of lead zirconate and titanate compounds, Phase III potassium nitride, bismuth titanate or the like, each of which has a Perovskite structure. When the proper electrical field is applied to a ferroelectric material, its polarization is arranged in the same direction. The ferroelectric material retains essentially the same polarization when the electric field is removed. This phenomenon is known as the spontaneous polarization. Because the direction of an applied electric field can change polarizations and the ferroelectric material has two threshold voltages for the reverse of its polarization, it can be thought of as a bistable capacitor.

Referring to FIG. 1, a ferroelectric memory cell MC is shown. The memory cell MC has a cell capacitor $C_F$ and an access transistor Tr acting as a switching device. Capacitor $C_F$ includes an insulating plate made of ferroelectric material used as a capacitor dielectric and two conductive plate electrodes formed on the opposite two surfaces of the plate. One plate electrode of the ferroelectric capacitor $C_F$ is coupled via the source-drain conduction path of the access transistor Tr to a bit line BL, and the other plate electrode of the capacitor $C_F$ is coupled to a plate line PL. The gate electrode of the transistor Tr is coupled to a word line WL.

When a voltage is applied to the ferroelectric plate of the capacitor $C_F$, the plate is polarized in the direction of the electric field. The switching threshold for changing the polarization state of the ferroelectric capacitor $C_F$ is defined as "coercive voltage". A ferroelectric material has a polarization-voltage characteristic which exhibits hysteresis, and the flow of current to the capacitor $C_F$ depends on its polarization state. If the voltage applied to the capacitor $C_F$ is greater than the coercive voltage, then the capacitor $C_F$ may change polarization states depending on the polarity of the applied voltage. Once polarized by applying a voltage to it in one direction or the opposite direction, the ferroelectric capacitor $C_F$ remains polarized even after the application of the voltage is stopped. Thus, the ferroelectric capacitor $C_F$ can store either logic "one" or logic "zero" in accordance with the state of polarization of the ferroelectric material between two plate electrodes.

FIGS. 2 and 3 illustrate hysteresis curves of polarization of the ferroelectric material in capacitor $C_F$ in accordance with logic states thereof. In each FIG. 2 or 3, the abscissa (or X axis) represents external voltage V applied across the two plate electrodes of the capacitor $C_F$, and the ordinate (or Y axis) represents polarization P on the ferroelectric material between two plate electrodes. Referring to FIGS. 2 and 3, it will be seen that two stable states exist at points "a" and "e" on the hysteresis curve even when no voltage is applied across the ferroelectric capacitor $C_F$. This is because the prior history of the voltage applied across the capacitor $C_F$ determines the stable state 'a' or 'e' which results when voltage is removed. So, the state point 'a' can represent logic "1", and the state point 'e' can represent logic "0".

As illustrated in FIG. 2, first, it will be assumed that the data "0" is stored in the ferroelectric capacitor $C_F$ whose polarization state at the point 'e'. When a voltage of −Ve greater than a coercive voltage of −Vc is applied to one plate electrode of the ferroelectric capacitor $C_F$, namely, if the voltage of Ve is applied to the plate line PL in a negative direction while the access transistor Tr is conducting, the polarization P is changed from the state point 'e' to the state point 'd' via the state point 'c' and an amount of the charge Q0 stored in the capacitor $C_F$ and corresponding to the state transition is fed out onto bit line BL through the access transistor Tr, resulting in a small voltage change on bit line BL. A resulting voltage change on the bit line BL is detected by a sense amplifier (not shown) connected with the bit line BL. This means that the data of 0 is read from the memory cell MC.

On the other hand, assuming that the data value of 1 is stored in the ferroelectric capacitor $C_F$ whose polarization state at the state point 'a', as illustrated in FIG. 3, in case the voltage −Ve is applied to the plate line PL while the access transistor Tr is conducting, the polarization P is changed from the state point 'a' to the state point 'd' via state points 'b' and 'c' and a relatively large amount of the charge Q1 stored in the capacitor $C_F$ and corresponding to the state transition is transferred onto bit line BL via the transistor Tr. A resulting voltage change on the bit line BL is detected by the sense amplifier connected with the bit line BL. This means that the data of 1 is read from the memory cell MC. In this case, however, the polarization P of the capacitor $C_F$ remains at the state point 'e' after the application of the voltage −Ve is stopped, that is, the polarization state of the capacitor $C_F$ is changed from the point 'a' to the point 'e'. After reading the data of 1 from the memory cell MC, thus, the same data "1" on the bit line BL should be written back onto the memory cell MC by lowering the voltage of the plate line PL. This rewrite sequence follows the reverse state transition form the state point 'e' to the state point 'h' via state points 'f' and 'g'.

However, if an abrupt voltage is applied to the ferroelectric capacitor $C_F$ during unexpected power down or power off state, there is a possibility that the data stored in the memory cell MC is damaged. More specifically, assuming that the data of 1 is stored in the ferroelectric capacitor $C_F$ whose polarization state is at the point 'a' and then the memory device is powered down. During such a power down or off state, if a word line increases in voltage due to the selection of the row decoder, causing the access transistor to be conducting, then the negative voltage −Ve is applied to the ferroelectric capacitor $C_F$ on condition that a voltage of the plate line PL is higher than that of the bit line by the voltage Vc. As a result, the polarization P of the ferroelectric capacitor $C_F$ is shifted from the state point 'a' to the state point 'd' via state points 'b' and 'c'. Therefore, after power down, the polarization P settles at the state point 'e' corresponding to the data value 0, which means that the contents of the memory cell MC is damaged.

An approach to overcome the above problem is found in U.S. Pat. No. 5,574,679 (Memory Data Protection For A Ferroelectric Memory) issued to Ohtsuki et al., on Nov. 12, 1996. According to the document by Ohtsuki et al., a ferroelectric memory device is provided with a word line selection controller which prevents all the word lines thereof from being selected when the power supply voltage becomes lower than a predetermined threshold voltage level. FIG. 4 illustrates the arrangement of the prior art word line selection controller. Referring to FIG. 4, the word line selection controller 10 includes a row controller 2, an address buffer 4, a row decoder 6, and a memory-cell (MC) protective circuit 8. The row controller 2 controls the input/output operation of the address buffer 4 and the decoding operation of the row decoder 6 based on the row control signal XC. The row address data ADx is retained in the address buffer 4 and then is decoded into a selection signal and nonselection signals by the row decoder 6. That is, the row decoder 6 selects one of the word line WL1–WLn and outputs the selection signal to the selected word line by decoding the row address data ADx stored in the address buffer 4. The MC protective circuit 8 is comprised of n switching transistors STr1–STrn and an inverter circuit IV1. The prior art ferroelectric memory device further includes a power supply voltage detector 12 which checks whether an output voltage of the power supply circuit is lower than a threshold voltage level. If the power supply voltage detector 12 outputs the low-voltage detection signal Vcd to the word line selection controller 10. The switching transistor STr1–STrn are turned on when a high voltage is applied to the gate electrodes thereof. Therefore, when receiving the low-voltage detection signal Vcd from the power supply voltage detector 12, the switching transistors STr1–STrn are simultaneously forced into conduction to set the word lines WL1–WLn at the grounding level independent of the output signals of the row decoder 6, so, thereafter, both the read and write operations of the memory device are prohibited.

However, during a read operation of the data "1", if the memory device is abruptly powered down as soon as the polarization state P of the ferroelectric capacitor $C_F$ is shifted from the point 'a' to the point 'e' via the points 'b', 'c' and 'd', the rewrite operation can not be executed. Consequently, after power down, the polarization P of the capacitor $C_F$ settles still at the point 'e', and thus the data damage of the memory cell MC is inevitable.

SUMMARY OF THE INVENTION

An object of the present invention, accordingly, is to overcome the drawbacks in the prior art semiconductor memories, and to provide a nonvolatile ferroelectric memory device with stable nonvolatile characteristics regardless of power up and power down modes.

It is another object of the present invention to provide a method for protecting the ferroelectric memory cells from data damage when a power supply voltage is at a lower Voltage level than a threshold voltage during either unexpected power down or power off state.

According to an aspect of the present invention, a ferroelectric memory device comprises means for detecting a power supply voltage of the memory device to generate a power state detection signal representative of a power supplying state of the memory device, means for generating an internal chip enable signal to enable a plurality of internal circuits in response to an external chip enable signal, and means for preventing memory access by controlling the internal chip enable signal generating means in response to the power state detection signal and the external chip enable signal so as to protect the stored data from damage. The internal chip enable generating means inactivates the internal chip enable signal regardless of the external chip enable signal while the power state detection signal is representative of an abnormal power supplying state of the memory device and the external chip enable signal is inactive. The internal chip enable signal generating means retains the internal chip enable signal active during a predetermined time when the power state detection signal is representative of an abnormal power supplying state of the memory device and the external chip enable signal is active.

According to another aspect of the present invention, a ferroelectric memory device comprises means for supplying a power supply voltage to the memory device, means for detecting the power supply voltage to generate a power state detection signal representative of power down state of the memory device, means for generating an internal chip enable signal to enable a plurality of internal circuits in response to an external chip enable signal, and means for inactivating the internal chip enable signal so as to disable the internal circuits in response to the power state detection signal and the external chip enable signal.

Another aspect of the present invention, a ferroelectric memory device comprises means for supplying a power supply voltage to the memory device, means for comparing the power supply voltage with a predetermined threshold voltage to generate first and second power detection signals when the power supply voltage is lower than the predetermined threshold voltage, wherein the first and second power detection signals both are representative of power on and off states of the semiconductor memory device, wherein the first power detection signal is low and the second power detection signal traces the power supply voltage level when the power supply voltage is lower than the predetermined threshold voltage, means for generating first and second internal chip enable signals each synchronized with an externally applied chip enable signal, means for generating a data sense enable signal in response to the first and second internal chip enable signals and the first power detection signal, and means for sensing and amplifying the stored data in response to the data sense enable signal. The internal chip enable signal generating means activates/inactivates the first and second internal chip enable signals in response to the first and second power detection signal and the external chip enable signal. The memory device further comprises a plurality of internal circuit operating in response to the first internal chip enable signal. The internal chip enable signal generating means inactivates the first internal chip enable signal regardless of the external chip enable signal when the first power detection signal goes low and the external chip enable signal is inactive. The memory device further comprises a plurality of internal circuit operating in response to the first internal chip enable signal. The internal chip enable signal generating means retains the first internal chip enable signal active for a predetermined time after the low power detection signal becomes active, in the event that the first power detection signal becomes active while the external chip enable signal is active. Activation and inactivation times of the first internal chip enable signal are controlled by the external chip enable signal during the power on state. The activation time of the first internal chip enable signal is controlled by the external chip enable signal and the inactivation time of the first internal chip enable signal is controlled by the first power detection signal during the power off state. The internal chip enable signal generating means comprises means for generating the second internal chip enable signal having the phases opposite to the external chip enable signal, means for generating a first timing control signal to control the activation time of the first internal chip enable signal in response to the second internal chip enable signal, means for generating a second timing control signal to control the inactivation time of the first internal chip enable signal in response to the first and second power detection signals, the data sense enable signal, and the first internal chip enable signal, and means for generating the first internal chip enable signal in response to the first and second timing control signal and the second power detection signal. The means for generating the first timing control signal comprises a first timing generator for receiving the second internal chip enable signal to generate a short pulse as the first timing control signal. The means for generating the second timing control signal comprises a second timing generator for generating a third timing control signal to control the inactivation time of the first internal chip enable signal in response to the data sense enable signal, a third timing generator for generating a fourth timing control signal to control the inactivation time of the first internal chip enable signal in response to the first and second power detection signal, the first internal chip enable signal and the third timing control signal, and a multiplexer for selecting one of the third and fourth timing control signal to output the selected timing control signal as the second timing control signal in response to the first power detection signal. The second timing generator for receiving the data sense enable signal to generate a short pulse as the third timing control signal. The third timing generator includes a latch circuit. The multiplexer can be implemented with an AND-OR-Inverter MOS logic circuit.

According to another aspect of the present invention, there is provided a method for protecting data stored in a ferroelectric random access memory chip device. First, a power supply voltage of the memory chip is compared with a predetermined threshold voltage level. Then, it is checked whether the chip is in a chip enable state if the power supply voltage is lower than the threshold voltage level. The chip enters into a chip disable state if the chip is in the chip enable state. In addition, the chip to retain its enable state if the chip is at present in a normal operation cycle and then forcing the chip to complete the present cycle and then the chip enters into its disable state. Furthermore, it is checked whether there is a requirement for chip enable if the power supply voltage is not lower than the threshold voltage level. If so, the chip performs a normal operation. If not, the chip then enters its standby mode.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings, wherein.

DETAILED DESCRIPTION OF THE PREFERRED EMBODIMENT

In the following description for purposes of explanation, specific configurations are set forth in order to provide a thorough understanding of the present invention. However, it will be apparent to those skilled in the art that the present invention may be practiced without the specific details. In other instances, well known circuits are shown in block diagram form in order not to obscure the present invention.

Figure 1:
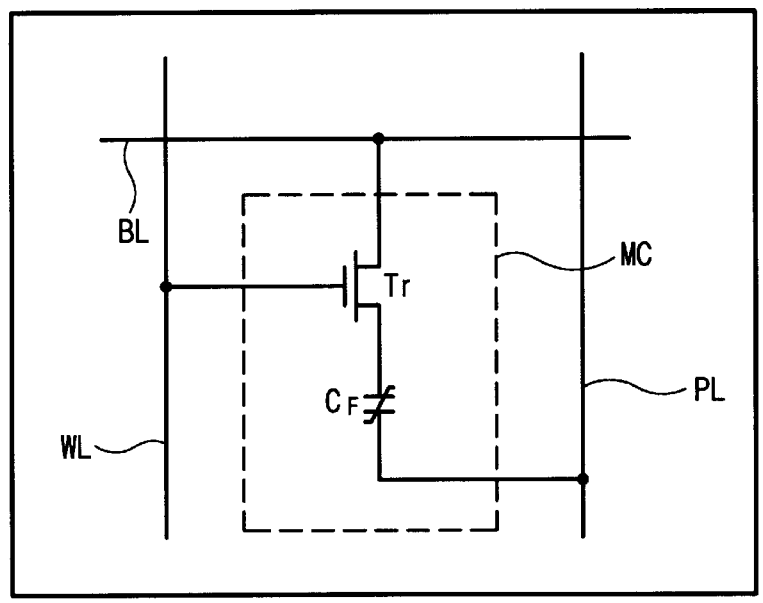
FIG. 1 is a circuit diagram of a typical ferroelectric memory cell consisting of one transistor and one capacitor.
Figure 2:
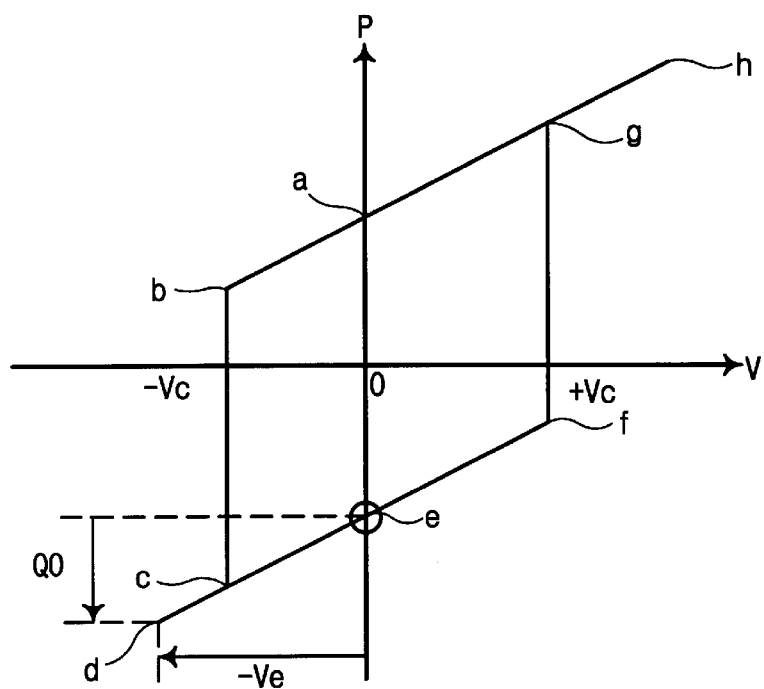
FIGS. 2 and 3 illustrate hysteresis curves of polarization of the ferroelectric material in capacitor in accordance with logic states thereof, FIG. 2 being for describing the read operation of data "0", and FIG. 3 being for describing the read operation of data "1"
Figure 3:
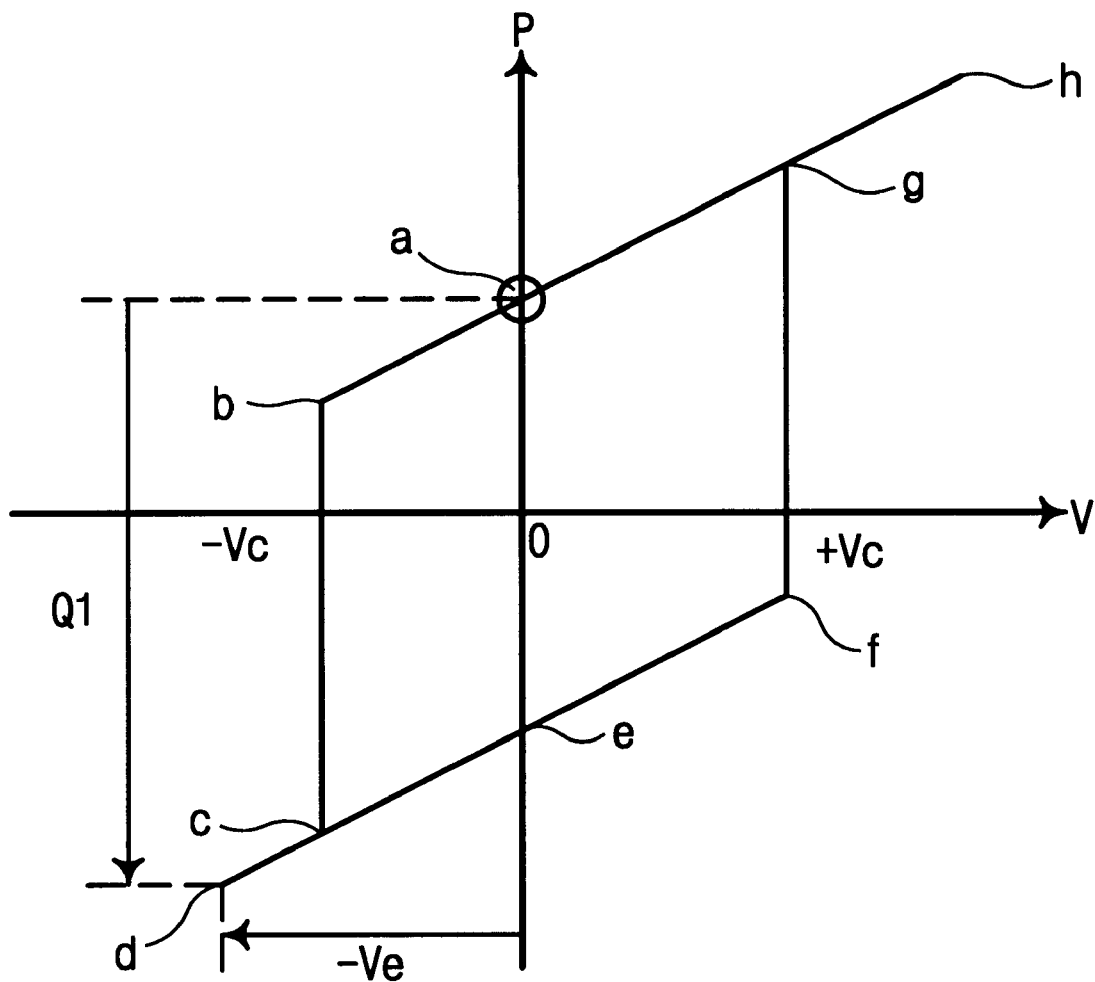
Figure 4:
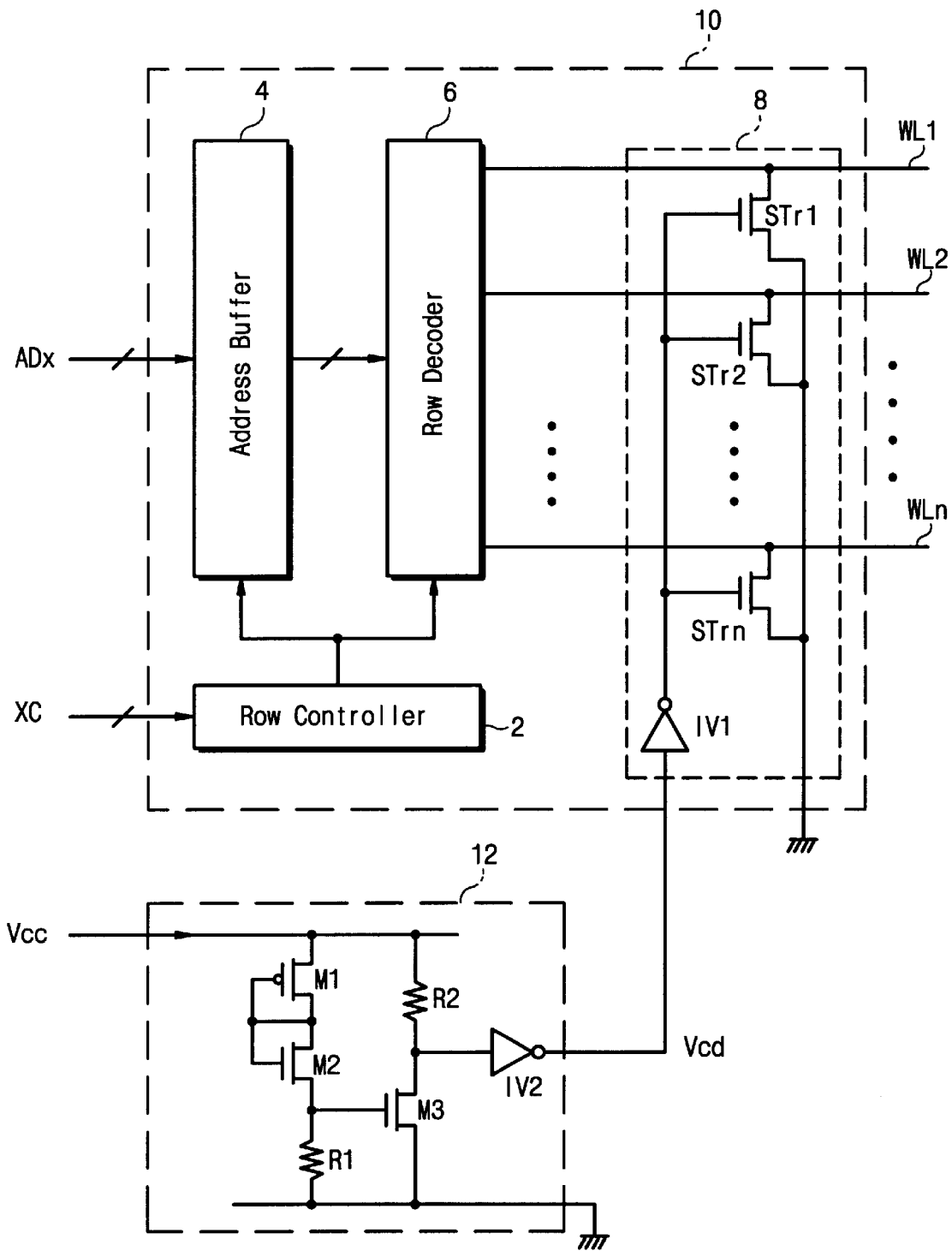
FIG. 4 is a circuit diagram of a ferroelectric memory data protection circuit according to the prior art.
Figure 5:
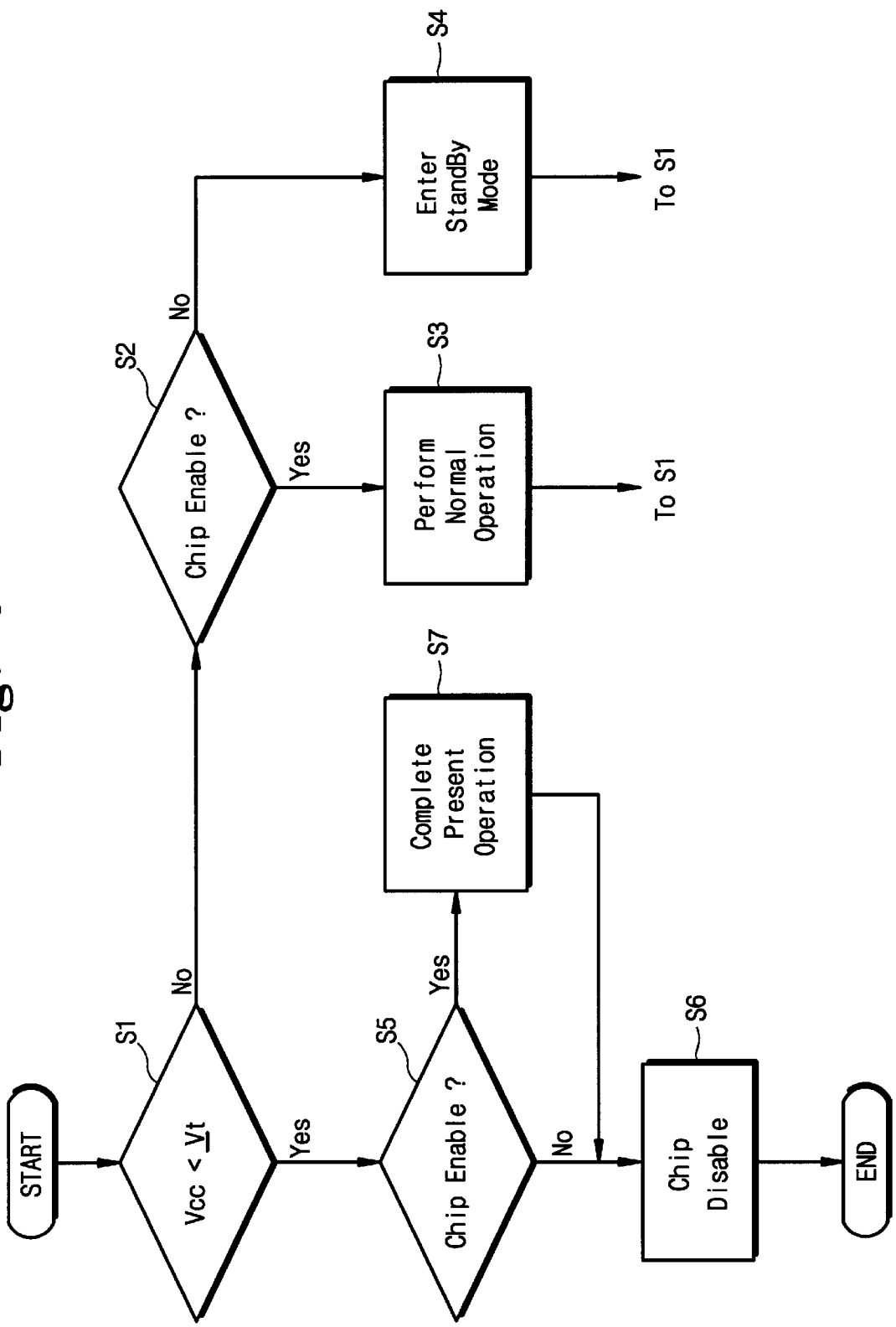
FIG. 5 is a flow chart illustrating a cell data protection method of a ferroelectric memory device according to the present invention.

FIG. 5 is a flow chart illustrating a cell data protection method of a ferroelectric random access memory (FRAM) chip device according to a preferred embodiment of the present invention. The contents of the FRAM cells are protected against damage when a power supply voltage Vcc goes lower than a predetermined threshold voltage level Vt. In general, chip power off time is about several milliseconds, but it takes several nanoseconds for a memory chip to perform a normal operation such as a read/write operation. Therefore, although the power supply voltage Vcc goes lower than the predetermined threshold voltage level Vt upon performing a read/write operation, an FRAM chip device can complete the current read/write operation during either unexpected power down or power off mode.

From now, a novel FRAM cell data protection method according to an embodiment of the present invention will be described in detail with reference to FIG. 5. At step S1, the power supply voltage Vcc of a chip is compared with a predetermined threshold voltage level Vt. If the power supply voltage Vcc is not lower than the threshold voltage level Vt, flow proceeds to step S2 wherein it is checked whether there is a requirement for chip enable. If so, flow proceeds to step S3 wherein the chip performs a normal operation such as a read/write operation, and then flow continues back to step S1. At step S2, if not, flow proceeds to step S4 wherein the chip enters standby mode (i.e., low power consumption mode), and then flow continues back to step S1. At step S1, if the power supply voltage Vcc is lower than the threshold voltage level Vt, flow proceeds to step S5 wherein it is checked whether the chip is in chip enable state, i.e., whether the chip is in a read/write operation cycle. If not, flow proceeds to step S6 wherein the chip enters into chip disable state, thereby preventing the chip from performing an additional read/write operation which may cause the data damages of the FRAM cells. At step S5, if the chip is at present in a read/write operation cycle, the chip retains its enable state and completes the present cycle even though the power supply voltage Vt decreases during unexpected power down or power off mode, and then flow advances to step S6, the chip enters into its disable state.

Figure 6:
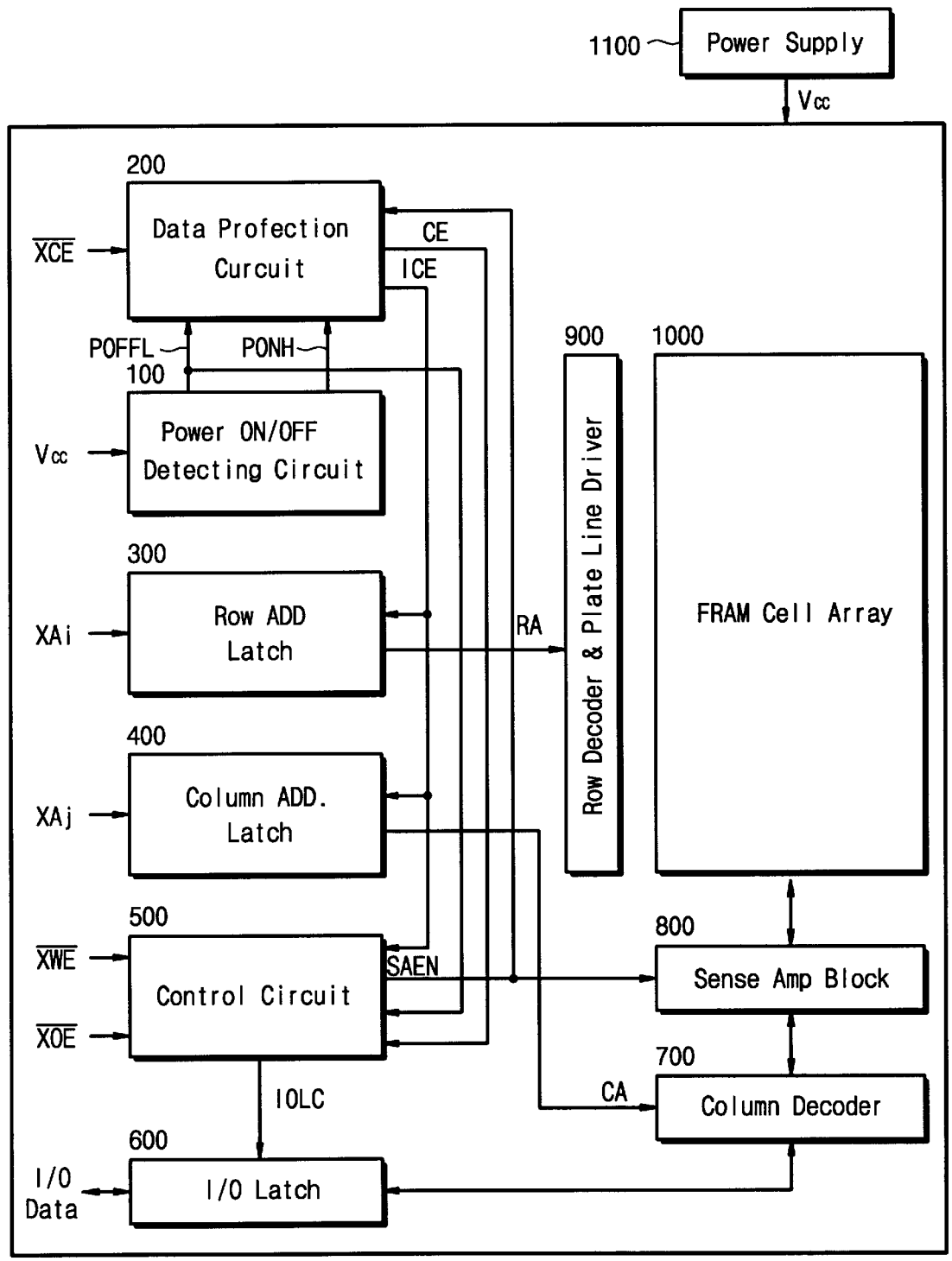
FIG. 6 is a block diagram illustrating a preferred embodiment of a ferroelectric memory device according to the present invention.

Referring to FIG. 6, illustrated is a preferred embodiment of an FRAM device according to the present invention. The FRAM device includes a power on/off detecting circuit 100, a data protection circuit (or chip enable controller) 200, a row address latch 300, a column address latch 400, a control circuit 500, an input/output (I/O) latch 600, a column decoder 700, a sense amplifier block 800, a row decoder and plate line driver block 900, and an FRAM cell array 1000. The FRAM device further includes a power supply 1100 for supplying the power supply voltage Vcc to a variety of internal circuit.

The FRAM cell array 1000 is comprised of a plurality of memory cells arranged in rows and columns. Each memory cell consists of an access transistor acting as a switching device and a ferroelectric capacitor, although not shown in FIG. 6. The ferroelectric capacitor includes an insulating plate made of ferroelectric material used as a capacitor dielectric and two conductive plate electrodes formed on the opposite two surfaces of the plate. One plate electrode of the ferroelectric capacitor is coupled via the source-drain conduction path of the access transistor to a bit line, and the other plate electrode of the capacitor is coupled to a plate line. The gate electrode of the transistor is coupled to a word line. The FRAM device is fed with a plurality of external signals, for example, a chip enable signal $\overline{XCE}$, a row address XAi, a column address XAj, a write enable signal $\overline{XWE}$, and an output enable signal $\overline{XOE}$.

The power on/off detecting circuit 100 detects the power on state and power off state by checking both whether an output voltage Vcc of the power supply 1100 rises above a threshold voltage level Vt and whether the power supply voltage Vcc falls below the threshold voltage level Vt. The power on/off detecting circuit 100 produces two power state detection signals POFFL and PONH representative of the power on and down (or off) states. During power up mode, the detection signals POFFL and PONH remain at ground level Vss until the power supply voltage Vcc arrives at the threshold level Vt. Thereafter, when the power supply voltage Vcc is equal to or higher than the threshold level Vt, the voltage level of each of the detection signals POFFL and PONH traces that of the power supply voltage Vcc. During power down mode, if the power supply voltage Vcc goes to or lower than the threshold level Vt, the detection signal POFFL falls into the ground level Vss but the detection signal PONH still traces the power supply voltage Vcc.

The data protection circuit (or chip enable controller) 200 is fed with the externally applied chip enable signal $\overline{XCE}$, and the detection signals POFFL and PONH from the power on/off detecting circuit 100. The data protection circuit 200 produces an internal chip enable signal CE synchronized with the external chip enable signal $\overline{XCE}$ and having the phases opposite to the signal $\overline{XCE}$. The data protection circuit 200 further produces a modified signal ICE by using the signal CE. The signal ICE is provided to the row address latch 300, the column address latch 400, and control circuit 500, which are directly associated with performing a read/write operation. With the application of the power supply voltage Vcc, while the internal chip enable signal ICE remains active, the internal circuits 300, 400, 500 and 800 controlled by the signal ICE operates in normal mode. On the contrary, if the signal ICE become inactive although the application of the power supply voltage Vcc, the internal circuits 300, 400 and 500 enter the standby mode. The internal chip enable signal ICE will be described later in detail.

The control circuit 500 is fed with the external write enable signal $\overline{XWE}$ and the external output enable signal $\overline{XOE}$. The control circuit 500 is also supplied with the detection signal POFFL from the power on/off detecting circuit 100 and the internal chip enable signals CE and ICE from the data protection circuit 200. The circuit 500 generates an I/O latch control signal IOLC to control the I/O latch 600 and a sense amp enable signal SAEN to control the sense amplifier block 800. The levels of the signals IOLC and SAEN depends on the CE signal. That is, the IOLC and SAEN signals remain active (high) while the signal CE active (high), but the signals IOLC and ASEN inactive (low) while the signal CE inactive (low). This will be described later with reference to FIG. 7. The sense amp enable signal SAEN is provided to the data protection circuit 200. Since the row address latch 300, column address latch 400, column decoder 700, and row decoder & plate line driver block 900 are well known to those skilled in the art, their detailed description is omitted herein.

Figure 7:
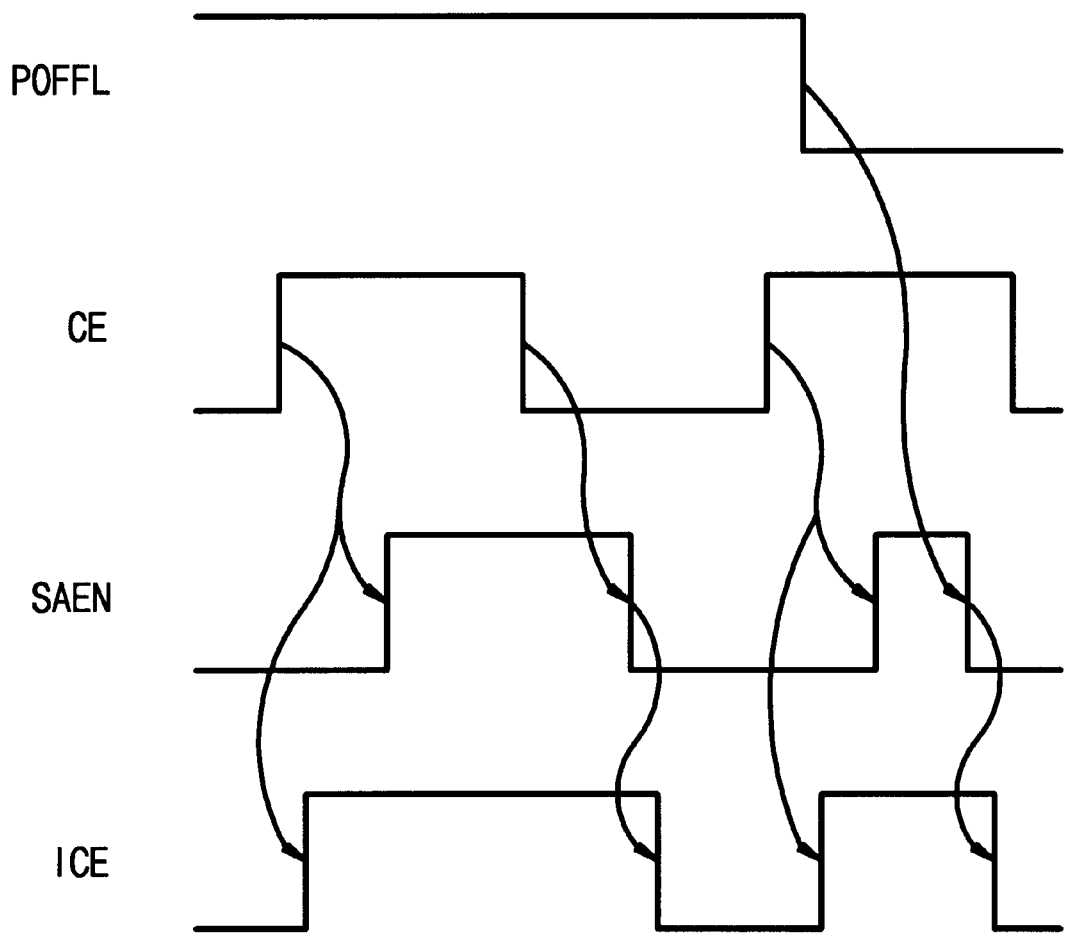
FIG. 7 is a timing diagram illustrating the timing relationship between the signals of the data protection circuit and the control circuit illustrated in FIG. 6.

FIG. 7 is a timing diagram illustrating the timing relationship between the signals of the data protection circuit 100 and the control circuit 500. As can be seen in the figure, there is a predetermined delay time between the internal chip enable signal CE (or the external chip enable signal $\overline{XCE}$) and the sense amp enable signal SAEN. The sense amp enable signal SAEN becomes activated in synchronism with the internal chip enable signal CE. The edge transition of the sense amp enable signal SAEN is controlled by the internal chip enable signal CE while the power on/off detection signal POFFL remains inactive (high). The sense amp enable signal SAEN is, however, forced into the inactive state (low) by the signal POFFL regardless of the signal CE after the signal POFFL has become active (low) although the signal CE still remains active (high).

Figure 8:
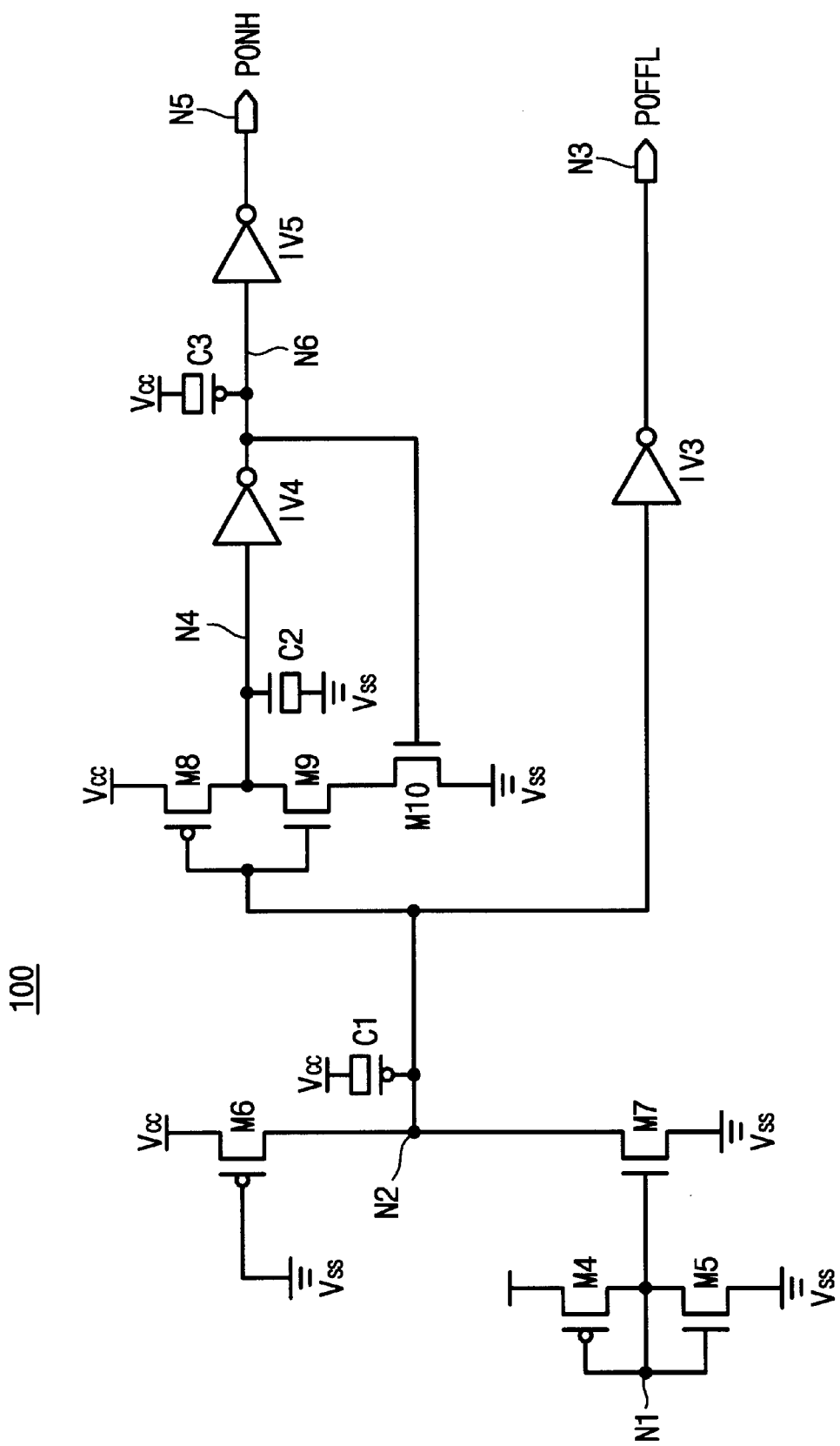
FIG. 8 is a detailed circuit diagram of the power on/off detecting circuit illustrated in FIG. 6.

Referring to FIG. 8, a detailed circuit construction of the power on/off detecting circuit 100 is illustrated. The power on/off detecting circuit 100 includes p-channel MOS transistors M4, M6 and M8, n-channel MOS transistors M5, M7, M9 and M10, MOS capacitors C1, C2 and C3, and inverters IV3, IV4 and IV5. The transistors M4 and M5 have their source-drain conduction paths coupled in series between the power supply voltage Vcc and the ground voltage Vss. The gate electrodes of the transistors M4 and M5 are commonly coupled to the junction node N1 of their conduction paths. This transistors M4 and M5 act as a voltage divider circuit for dividing the power supply voltage Vcc. The transistor M6 has its gate electrode coupled to the ground voltage Vss. The transistor M7 has its gate electrode coupled to the junction node N1 of the transistors M4 and M5. The source-drain conduction paths of the transistors M6 and M7 are coupled between the power supply voltage Vcc and the ground voltage Vss. The capacitor C1 consisting of a p-channel MOS device is coupled between the power supply voltage Vcc and the junction node of the transistors M6 and M7. The inverter IV3 has its input terminal coupled to the junction node N2 of the transistors M6 and M7, and it outputs the detection signal POFFL through the node N3. The conduction paths of the transistors M8–M10 are coupled in series between the power supply voltage Vcc and the ground voltage Vss in order. The gate electrodes of the transistors M8 and M9 are commonly coupled to the junction node N2 of the transistors M6 and M7. The capacitor C2 consisting of an n-channel MOS device is coupled between the ground voltage Vss and the junction node N4 of the transistors M8 and M9. The inverter IV4 has its input terminal coupled to the node N4 and its output terminal coupled to the node N6. The gate electrode of the transistor M10 is coupled to the output terminal of the inverter IV4, i.e., the node N6. The capacitor C3 consisting of an n-channel MOS device is coupled between the power supply voltage Vcc and the node N6. The inverter IV5 has its input terminal coupled to the node N6, and it outputs the detection signal PONH through the node N5. It should be noted herein that all inverters including the inverters IV3–IV5 are supplied with the power supply voltage Vcc, although not shown in the Figures.

The capacitors C1–C3 retain the nodes N2, N4 and N6 at either the power supply voltage or ground voltage until the nodes N2, N4 and N6 are set to normal logic levels during power up and power down states.

During power up mode, the transistor M7 is turned off until the power supply voltage Vcc arrives at the threshold voltage level Vt. At this time, the node N2 thus goes high, so the detection signal POFFL remains at the ground level Vss. Simultaneously, the transistors M9 and M10 are turned on and the node N4 goes low, so the node N6 is latched to the power supply voltage Vcc. Therefore, the detection signal PONH also remains at the ground level Vss. When the power supply voltage Vcc reaches the threshold level Vt, the transistor M7 is turned on. So, the node N2 goes low and the detection signal POFFL traces the power supply voltage Vcc. In this case, the transistor M8 is turned on and the node N4 is set high since the capacitor C2 is charged up to the Vcc. Therefore, the node N6 goes to the ground level Vss and the detection signal PONH traces the power supply voltage Vcc. Thereafter, if the power supply voltage Vcc decreases to the threshold voltage Vt, the transistor M7 is turned off and the node N2 is set high again. So, the detection signal POFFL is pulled down to the ground level Vss. Although the node N4 goes high again and the transistor M8 is turned off, the node N4 still remains high due to the charge of the capacitor C2. The node N6 is thus set to the ground voltage Vss, causing the detection signal PONH to trace the power supply voltage Vcc.

As described above, if the power supply voltage Vcc is equal to or higher than the threshold level Vt during power on mode, the voltage level of each of the detection signals POFFL and PONH traces that of the power supply voltage Vcc. During power down, if the power supply voltage Vcc goes to or lower than the threshold level Vt, the detection signal POFFL falls into the ground level Vss but the detection signal PONH still traces the power supply voltage Vcc. The threshold voltage Vt of the power on/off detecting circuit 100 can be adjusted appropriately by varying the threshold voltages of the transistors M4, M5 and M7.

Figure 9:
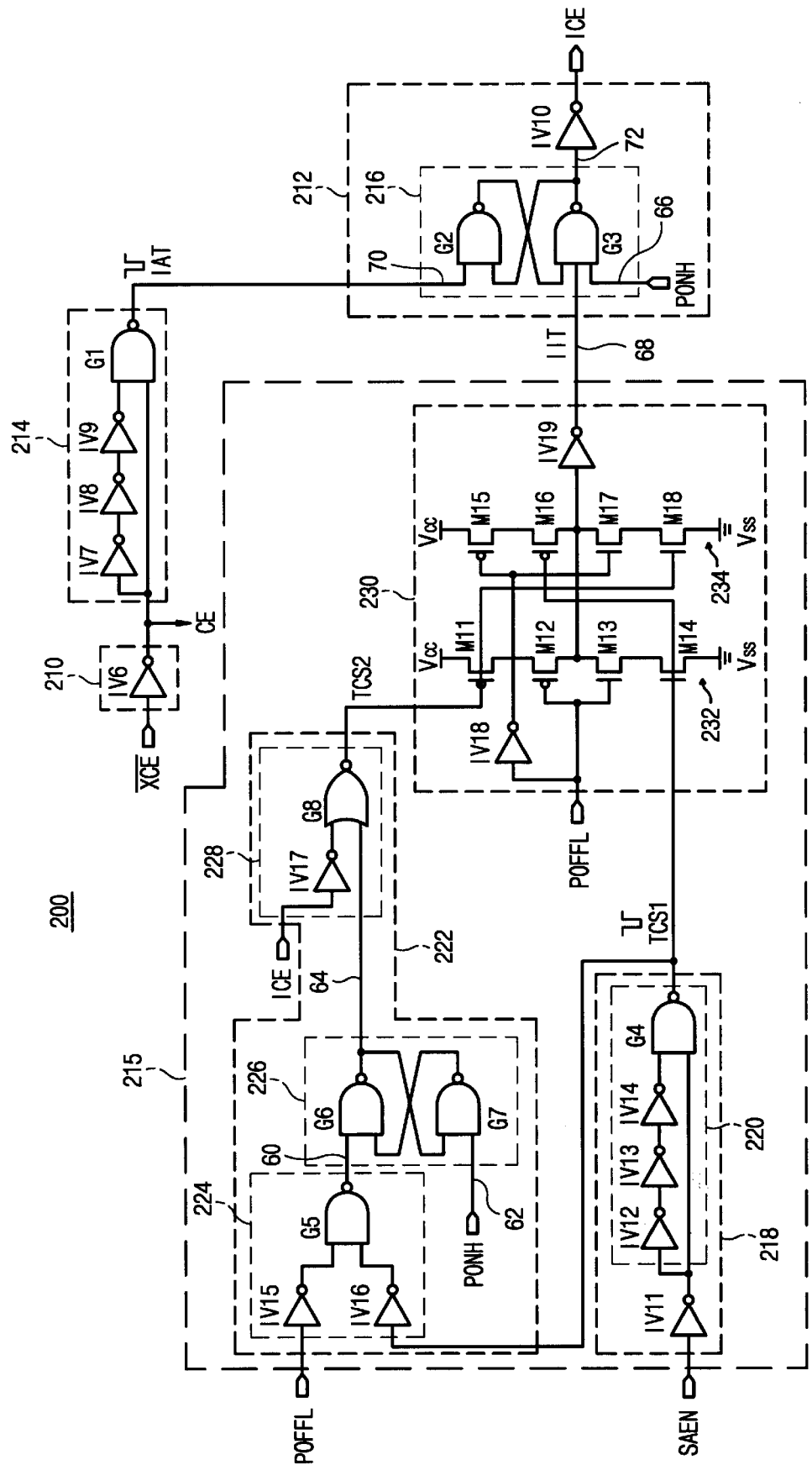
FIG. 9 is a detailed circuit diagram of the data protection circuit illustrated in FIG. 6.

Referring to FIG. 9, a detailed circuit construction of the data protection circuit 200 is illustrated. The data protection circuit 200 includes a chip enable buffer 210 consisting of an inverter IV6. The buffer 210 generates the internal chip enable signal CE synchronized with the external chip enable signal $\overline{XCE}$ and having the phases opposite to the signal $\overline{XCE}$. The internal chip enable signal CE is provided to the control circuit 500, as described before (see FIG. 6). The control circuit 500 generates the sense amp enable signal SAEN for controlling the sense amplifier block 800. The edge transition of the sense amp enable signal SAEN is controlled by the internal chip enable signal CE while the signal POFFL remains active. However, when the signal POFFL becomes inactivated, the sense amp enable signal SAEN is made inactive by the signal POFFL regardless of the internal chip enable signal CE.

The data protection circuit 200 further includes an ICE generator 212 for generating the internal chip enable signal ICE, an ICE activation timing controller 214 for generating the signal IAT used to control the activation timing of the ICE signal, and an ICE inactivation timing controller 215 for generating the signal IIT used to control the inactivation timing of the ICE signal. The ICE generator 212 is comprised of a Set-Reset (S-R) latch 216 and an inverter IV10. The S-R latch 216 has three active low inputs, i.e., two 'Set' inputs 66 and 68 and a 'Reset' input 70. The S inputs 66 and 68 of the latch 216 are fed with the signal PONH from the power on/off detecting circuit 100 (see FIG. 6) and the ICE inactivation timing control signal IIT from the ICE inactivation timing controller 215, respectively. The R (Reset) input 70 of the latch 216 is fed with the ICE activation timing control signal IAT from the ICE activation timing controller 214. The latch 216 has its output (Q) 72 coupled to the inverter IV10 whose output signal is used as the internal chip enable signal ICE. If one or both S input 66 and 68 of the latch 216 are set low while its R input 70 is high, then its output 72 goes high. On the other hand, if the R input 70 is set low while both S inputs 66 and 68 are high, the output 72 goes low. Simultaneous low-to-high transition of the S and R inputs 66, 68 and 70 will cause the output 72 to be indeterminate. The inputs 66, 68 and 70 are voltage level triggered and are not affected by transition time of the input data. The pulse duration of the signal ICE varies with the power supply voltage level.

The ICE activation timing controller 214 includes a short pulse generator consisting of inverters IV7–IV9 and a NAND gate G1. The ICE activation timing controller 214 receives the internal chip enable signal CE and generates the ICE activation timing control signal IAT. The signal IAT is a negative polarity of temporary pulse signal (or short pulse signal) generated by the high-to-low transition of the CE signal.

The ICE inactivation timing controller 215 includes a first inactivation timing controller 218, a second inactivation timing controller 222, and an AOI (AND-OR-Inverter) multiplexer 230. The first inactivation timing controller 218 is comprised of an inverter IV11, and a short pulse generator 220 formed by inverters IV12–IV14 and a NAND gate G4. The controller 218 generates the first inactivation timing control signal TCS1 in response to the sense amp enable signal SAEN from the control circuit 500 (see FIG. 6). The signal TCS1 is a negative polarity of temporary pulse signal generated by the low-to-high transition of the SAEN signal. The second inactivation timing controller 222 includes an input gate logic 224 formed by inverters IV15–IV16 and a NAND gate G5 which function as an OR gate, a R-S latch 60 with NAND gates G6 and G7, and an output gate logic 228 formed by an inverter IV17 and a NOR gate G8. The signals POFFL and TCS1 are applied to the inputs of the logic 224 (i.e., inputs of the inverters IV15–IV16), respectively. The latch 226 has its S input 60 coupled with the output of the NAND gate G5 in the logic 224, and its R input 62 fed with the signal PONH. If the S input 60 is set low while the R input 62 is high, the output 64 goes high. On the other hand, if the R input 62 is set low while the S input 60 is high, the output (Q) 64 goes low. Simultaneous transition of the S and R inputs 60 and 62 from low to high levels will cause the output 64 to be indeterminate. Both inputs 60 and 62 are voltage level triggered and are not affected by transition time of the input data. In the logic 228, the NOR gate G8 has one input for receiving the signal ICE through the inverter IV17 and the other input coupled to the output 64 of the latch 226. The second inactivation timing controller 222 generates the second inactivation timing control signal TCS2 in response to the signals TCS1, POFFL, PONH and ICE. The AOI multiplexer 230 includes normal inverters IV18 and IV19 and triple gate inverters 232 and 234. The inverter 232 consists of p-channel transistors M11 and M12, and n-channel transistors M13 and M14. The transistors M11–M14 have their conduction paths coupled in series between the power supply voltage Vcc and the ground voltage Vss. The conduction path junction of the transistors M12 and M13 is coupled to the input of the inverter IV19. The gate of the transistor M11 is fed with the signal TCS2 from the logic 228, and the gates of the transistors M12 and M13 are fed with the signal POFFL from the power on/off detecting circuit 100 (see FIG. 6). The signal POFFL is used as a selection control signal of the multiplexer 230. The inverter 234 consists of p-channel transistors M15 and M16, and n-channel transistors M17 and M18. The transistors M15–M18 have their conduction paths coupled in series between the power supply voltage Vcc and the ground voltage Vss. The conduction path junction of the transistors M16 and M17 is coupled to the input of the inverter IV19. The gates of the transistors M15 and M17 receive the signal POFFL through the inverter IV18. The gate of the transistor M16 receives the signal TCS1, and the gate of the transistor M18 receives the signal TCS2. The output signal of the inverter IV19 is provided as the ICE inactivation control signal IIT to the ICE generator 212. The AOI multiplexer 230 selects one of the signals TCS1 and TCS2 as the ICE inactivation control signal IIT in response to the signal POFFL.

Hereinafter, the operation of FRAM device with the power on/off detecting circuit and the data protection circuit according to the present invention will be described in detail, with reference to FIGS. 6 through 11.

Figure 10:
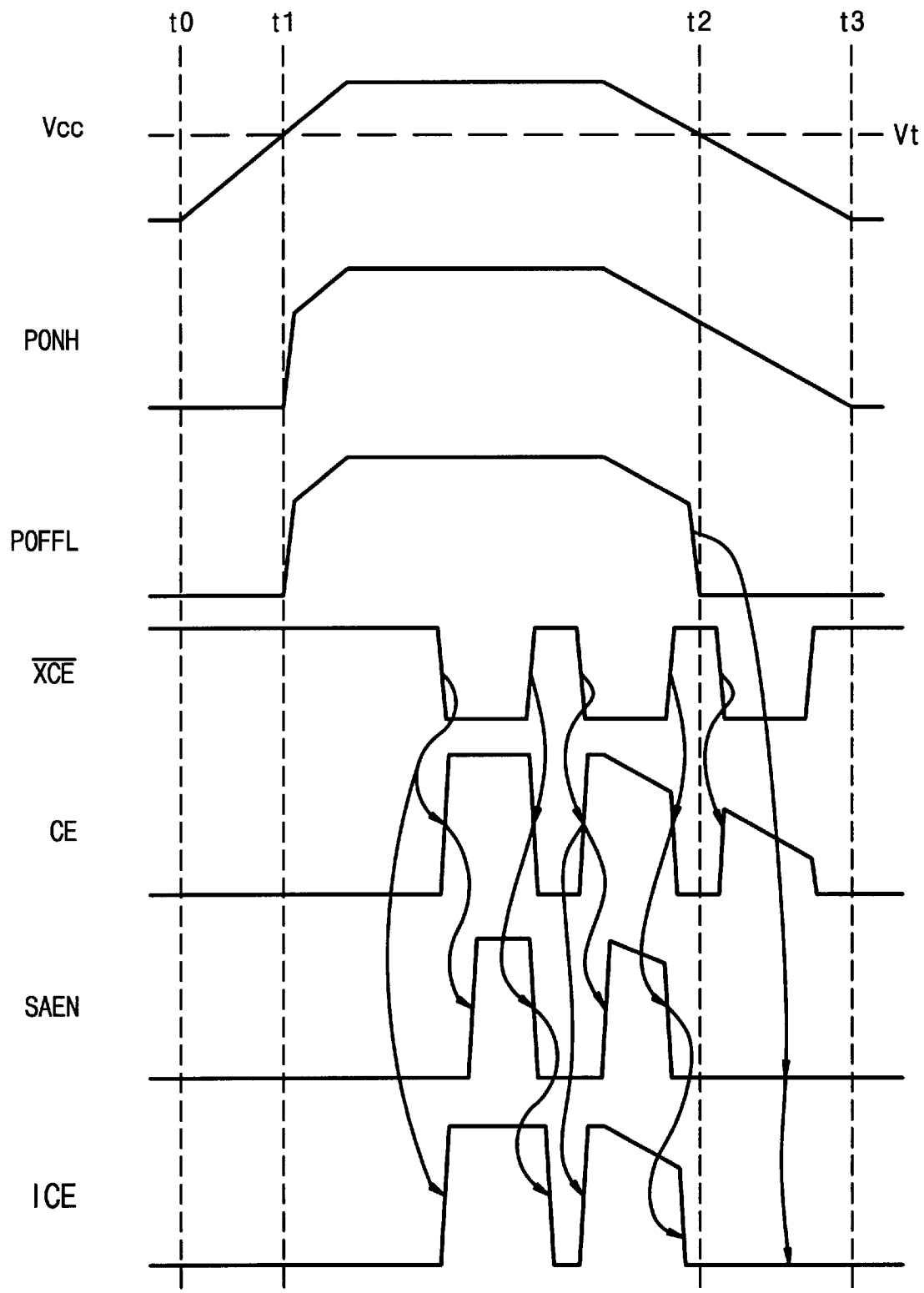
FIG. 10 is a timing diagram of the memory device of the invention, in case the device is powered down during a standby mode.

Referring first to FIG. 10, there is illustrated a timing diagram of the ferroelectric memory device according to the invention, in case where the power supply voltage Vcc is lower than the threshold voltage level Vt during a standby mode. For a period t0–t1 when the power supply voltage Vcc does not yet reach the threshold level Vt in power up mode, the detection signals POFFL and PONH are set to the ground level Vss (low). In this period, the signal IAT is set high since the external chip enable signal $\overline{XCE}$ remains high. With the signal IAT of high and the signal PONH of low level, the latch 216 enters into its 'Set state' and thus generates its output 72 of high level, making the signal ICE low (inactive).

In addition, the SAEN signal is set low by the control circuit 500, as described before. With the SAEN of low level, the TCS1 signal goes high, and thus the logic 224 acting as an OR gate outputs its output signal 60 of high level. With the signal PONH of low and the signal 60 of high level, the latch 226 enters its Reset state and generates its output (Q) 64 of low level, and as a result the TCS2 level from the logic 228 is determined by the ICE level. During this period t0–t1, the transistors M11 and M12 are turned on since the signals POFFL and TCS2 are low, making the IIT signal low.

At time t1 when the power supply voltage Vcc arrives at the threshold level Vt, the signals POFFL and PONH are immediately pulled up to the threshold voltage level Vt, that is, the signals POFFL and PONH both go high. At this time, because the signals TCS1 and POFFL are high, transistors M13 and M14 are turned on, thereby the signal IIT goes high. With the signals IAT, PONH and IIT of high levels, the output (Q) 72 of the latch 216 is maintained at the same state as the previous state (i.e., high). Accordingly, the ICE signal remains at the same level as that in the period t0–t1 (i.e., low level).

For a period t1–t2, normal operations such as read/write operations can be performed. As can be seen, the signals POFFL and PONH trace the power supply voltage Vcc. In this period, if the external chip enable signal $\overline{XCE}$ becomes active (low) for performing a normal operation, the internal chip enable signal CE and sense amp enable signal SAEN go high and after a predetermined delay time determined by the inverters IV7–IV9 the IAT signal goes low. With the IAT signal of low, PONH signal of high, and IIT signal of high level, the latch 216 enters its Reset state and thus the latch outputs its output 72 of low level, making the ICE signal high (active). Therefore, all internal circuits including the sense amplifier block can be in a normal operation. By the low-to-high transition of the signal SAEN synchronized with the signal CE, the signal TCS1 goes low after an elapse of a given time from the high-to-low transition of the signal IAT. With the signal TCS1 of low and the signal POFFL of high level, transistors M15 and M16 become conductive. Therefore, the signal IIT goes low, so the latch 216 enters its Set state in which its output 72 becomes high. As a result, the ICE signal become inactivated (low), causing the internal circuits 300, 400, 500 and 800 to enter the standby mode and this standby mode is maintained while the signal $\overline{XCE}$ remains inactive.

At time t2 when the power supply voltage lowers to the threshold voltage level Vt, the signal POFFL is pulled down to the ground level Vss by the power on/off detecting circuit 100. After time t2, if the power supply voltage Vcc slowly lowers below the threshold voltage level Vt and the $\overline{XCE}$ signal becomes active, the internal chip enable signal CE also becomes active with a lower power supply voltage than that in the normal state. In this case, however, the control circuit 500 generates the signal SAEN of low level since the signal POFFL goes active low, causing the signal ICE to remain low. Therefore, all internal circuits including the sense amplifier block 800 are disabled. This means that a read/write operation is prohibited at a lower power supply voltage level and as a result the ferroelectric memory cell data damage can be protected. A read/write operation of FRAM device with an abnormally low power supply voltage level causes the amount of charge corresponding to cell data to decrease, this results in the decreased data sensing margin. According to this invention, therefore, such a drawback can also be overcome.

Figure 11:
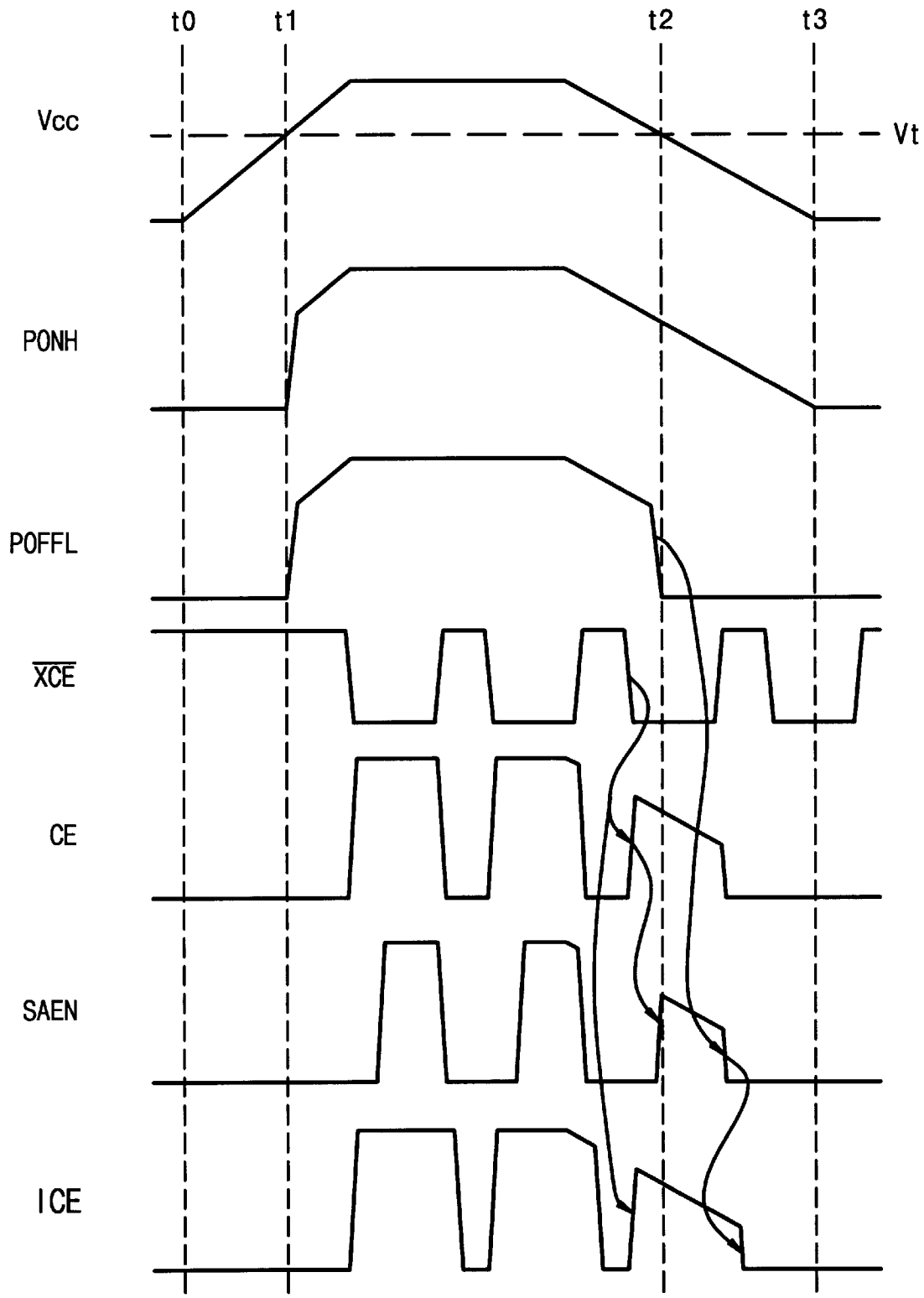
FIG. 11 is a timing diagram of the memory device of the invention, in case the device is powered down during a normal operation mode.

FIG. 11 is a timing diagram of the ferroelectric memory device according to the invention, in case where the power supply voltage Vcc is lower than the threshold voltage level Vt during a normal operation mode. As can be seen from FIG. 11, it will be appreciated that the device operation in the periods prior to the time t2 is same as that in FIG. 10. That is, the signals CE, SAEN and ICE are made active and inactive depending upon the signal $\overline{XCE}$. Therefore, to avoid descriptive duplication, the detailed description for the same periods will be omitted.

At time t2, if the power supply voltage decreases to the threshold voltage level Vt soon after the chip enable signals $\overline{XCE}$, CE and ICE have become active, the control circuit 500 generates the sense amp enable signal SAEN of the power supply voltage level (approximately high) in synchronism with the signal CE as described before. Even after the time t2, thus, a minimum cycle necessary for a normal operation (i.e., minimum read or write cycle) can be available without data damage due to the incomplete termination of the memory access cycle. After an elapse of time from the low-to-high transition of the sense amp enable signal SAEN, i.e., after at least data sensing period from the activation time of the ICE signal has elapsed, the TCS1 signal goes temporally low. With the signals TCS1 and POFFL of low levels, the logic 224 (see FIG. 9) has its output 60 of low level. Thus, the latch 226 is set and its output 64 goes high, so the logic 228 generates the signal TCS2 of low level. As a result, the transistors M11 and M12 become conductive since the signal POFFL remains low. Therefore, the latch 216 is set and so its output 72 becomes high. Consequently, the ICE signal become inactivated (low), causing the internal circuits to be disabled although the signal $\overline{XCE}$ still remains active.

As described above, according to the present invention, if the power down occurs while an FRAM device is in a read/write cycle, the device retains its enable state to complete the current cycle, thereby protecting the FRAM cell data against damage when a power supply voltage Vcc goes down.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A semiconductor memory device comprising:
   means for supplying a power supply voltage to the memory device;
   means having a ferroelectric element, for storing data;
   means for detecting the power supply voltage to generate a power state detection signal representative of a power supplying state of the memory device;
   means responsive to an external chip enable signal to enable the memory device, for generating an internal chip enable signal to enable a plurality of internal circuits; and
   means for preventing memory access by controlling the internal chip enable signal generating means in response to the power state detection signal and the external chip enable signal so as to protect the stored data from damage.

2. The memory device according to claim 1, wherein the internal chip enable generating means inactivates the internal chip enable signal regardless of the external chip enable signal while the power state detection signal is representative of an abnormal power supplying state of the memory device and the external chip enable signal is inactive.

3. The memory device according to claim 1, wherein the internal chip enable signal generating means retains the internal chip enable signal active during a predetermined time when the power state detection signal is representative of an abnormal power supplying state of the memory device and the external chip enable signal is active.

4. A semiconductor memory device comprising:
   means for supplying a power supply voltage to the memory device;
   means having a ferroelectric element, for storing data;
   means for detecting the power supply voltage to generate a power state detection signal representative of power down state of the memory device;
   means responsive to an external chip enable signal to enable the memory device, for generating an internal chip enable signal to enable a plurality of internal circuits; and
   means responsive to the power state detection signal and the external chip enable signal, for inactivating the internal chip enable signal so as to disable the internal circuits.

5. The memory device according to claim 4, wherein the internal chip enable generating means inactivates the internal chip enable signal regardless of the external chip enable signal while the power state detection signal is representative of the power down state of the memory device and the external chip enable signal is inactive.

6. The memory device according to claim 4, wherein the internal chip enable signal generating means retains the internal chip enable signal active during a predetermined time even though the power state detection signal is representative of the power down state of the memory device and the external chip enable signal is active.

7. The memory device according to claim 4, further comprising means for generating a data sense enable signal in response to the internal chip enable signal, and means for sensing and amplifying the stored data in response to the data sense enable signal.

8. The memory device according to claim 7, wherein the data sense enable signal generating means inactivates the data sense enable signal when the internal chip enable signal becomes inactive.

9. A semiconductor memory device comprising:
   means for supplying a power supply voltage to the memory device;
   means having a ferroelectric capacitor, for storing data in the ferroelectric capacitor;
   means for comparing the power supply voltage with a predetermined threshold voltage to generate first and second power detection signals when the power supply voltage is lower than the predetermined threshold voltage, the first and second power detection signals both representative of power on and off states of the semiconductor memory device, the first power detection signal being low and the second power detection signal tracing the power supply voltage level when the power supply voltage is lower than the predetermined threshold voltage;
   means for generating first and second internal chip enable signals each synchronized with an externally applied chip enable signal;
   means for generating a data sense enable signal in response to the first and second internal chip enable signals and the first power detection signal; and
   means for sensing and amplifying the stored data in response to the data sense enable signal;
   wherein the internal chip enable signal generating means activates/inactivates the first and second internal chip enable signals in response to the first and second power detection signal and the external chip enable signal.

10. The memory device according to claim 9, further comprising a plurality of internal circuit operating in response to the first internal chip enable signal, wherein the internal chip enable signal generating means inactivates the first internal chip enable signal regardless of the external chip enable signal when the first power detection signal goes low and the external chip enable signal is inactive.

11. The memory device according to claim 9, further comprising a plurality of internal circuit operating in response to the first internal chip enable signal, wherein the internal chip enable signal generating means retains the first internal chip enable signal active for a predetermined time after the low power detection signal becomes active, in the event that the first power detection signal becomes active while the external chip enable signal is active.

12. The memory device according to claim 9, wherein activation and inactivation times of the first internal chip enable signal are controlled by the external chip enable signal during the power on state.

13. The memory device according to claim 9, wherein an activation time of the first internal chip enable signal is controlled by the external chip enable signal and an inactivation time of the first internal chip enable signal is controlled by the first power detection signal during the power off state.

14. The memory device according to claim 9, wherein the internal chip enable signal generating means comprising:

means for generating the second internal chip enable signal having the phases opposite to the external chip enable signal;

means for generating a first timing control signal to control the activation time of the first internal chip enable signal in response to the second internal chip enable signal;

means for generating a second timing control signal to control the inactivation time of the first internal chip enable signal in response to the first and second power detection signals, the data sense enable signal, and the first internal chip enable signal; and means for generating the first internal chip enable signal in response to the first and second timing control signal and the second power detection signal.

15. The memory device according to claim 14, wherein the means for generating the first timing control signal comprises a timing generator for receiving the second internal chip enable signal to generate a short pulse as the first timing control signal.

16. The memory device according to claim 14, wherein the means for generating the second timing control signal comprises:

a first timing generator for generating a third timing control signal to control the inactivation time of the first internal chip enable signal in response to the data sense enable signal;

a second timing generator for generating a fourth timing control signal to control the inactivation time of the first internal chip enable signal in response to the first and second power detection signal, the first internal chip enable signal, and the third timing control signal; and a multiplexer for selecting one of the third and fourth timing control signal to output the selected timing control signal as the second timing control signal in response to the first power detection signal.

17. The memory device according to claim 16, wherein the first timing generator for receiving the data sense enable signal to generate a short pulse as the third timing control signal.

18. The memory device according to claim 16, the second timing generator comprises a latch circuit.

19. The memory device according to claim 16, the multiplexer is formed by an AND-OR-Inverter MOS logic circuit.

20. A method for protecting data stored in a ferroelectric random access memory chip device comprising the steps of:

comparing a power supply voltage of the memory chip with a predetermined threshold voltage level;

checking whether the chip is in a chip enable state if the power supply voltage is lower than the threshold voltage level; and allowing the chip to enter into a chip disable state if the chip is in the chip enable state.

21. The method of the claim 20, further comprising the steps of:

forcing the chip to retain its enable state if the chip is at present in a normal operation cycle and then forcing the chip to complete the present cycle; and allowing the chip to enter into its disable state.

22. The method of the claim 21, further comprising the steps of:

checking whether there is a requirement for chip enable if the power supply voltage is not lower than the threshold voltage level;

allowing the chip to perform a normal operation if there is the requirement for chip enable; and forcing the chip to enter its standby mode if there is no requirement for the chip enable.

\* \* \* \* \*